United States Patent
Sampath

(10) Patent No.: US 9,302,905 B1
(45) Date of Patent: Apr. 5, 2016

(54) METHOD FOR FORMING A MICROFABRICATED STRUCTURE

(71) Applicant: Innovative Micro Technology, Goleta, CA (US)

(72) Inventor: Suresh K Sampath, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 14/738,980

(22) Filed: Jun. 15, 2015

(51) Int. Cl.
*H01L 21/00* (2006.01)
*B81C 1/00* (2006.01)
*H01L 21/027* (2006.01)

(52) U.S. Cl.
CPC ..... *B81C 1/00412* (2013.01); *B81C 2201/0143* (2013.01); *H01L 21/0272* (2013.01)

(58) Field of Classification Search
None
See application file for complete search history.

(56) References Cited

U.S. PATENT DOCUMENTS

| | | | | |
|---|---|---|---|---|
| 5,275,695 A * | 1/1994 | Chang | ................ | C23F 1/02 216/27 |
| 5,597,764 A * | 1/1997 | Koh | ................ | H01L 21/28 257/E21.158 |
| 5,970,328 A * | 10/1999 | Park | ................ | H01L 21/28581 257/E21.173 |
| 7,864,006 B2 | 1/2011 | Foster et al. | | |
| 2001/0014524 A1* | 8/2001 | Farrar | ................ | H01L 24/11 438/613 |
| 2003/0042903 A1* | 3/2003 | Hasegawa | ................ | B82Y 10/00 324/252 |
| 2011/0143505 A1* | 6/2011 | Ahn | ................ | H01K 29/66462 438/186 |
| 2012/0020028 A1* | 1/2012 | Bachman | ................ | H01L 23/3677 361/719 |

OTHER PUBLICATIONS

U.S. Appl. No. 13/987,463, filed Feb. 22, 2011, Zeyen.

* cited by examiner

*Primary Examiner* — Angel Roman
(74) *Attorney, Agent, or Firm* — Jaquelin K. Spong

(57) ABSTRACT

A method for forming a feature in a device layer, including forming a first layer of a liftoff material and a second layer of photoresist over the liftoff material, exposing the photoresist and developing the photoresist and the liftoff layer. The photoresist develops at a slower rate than the liftoff layer. The development results in a first opening in the lift off layer and a second opening in the photoresist layer wherein the first opening is smaller than the second opening because of the different developing rates. The device layer is then dry etched or ion milled through the opening. Subsequent removal of the first layer and second layer leaves a clean surface of the patterned device layer, without the fences that can be formed using other methods.

19 Claims, 7 Drawing Sheets

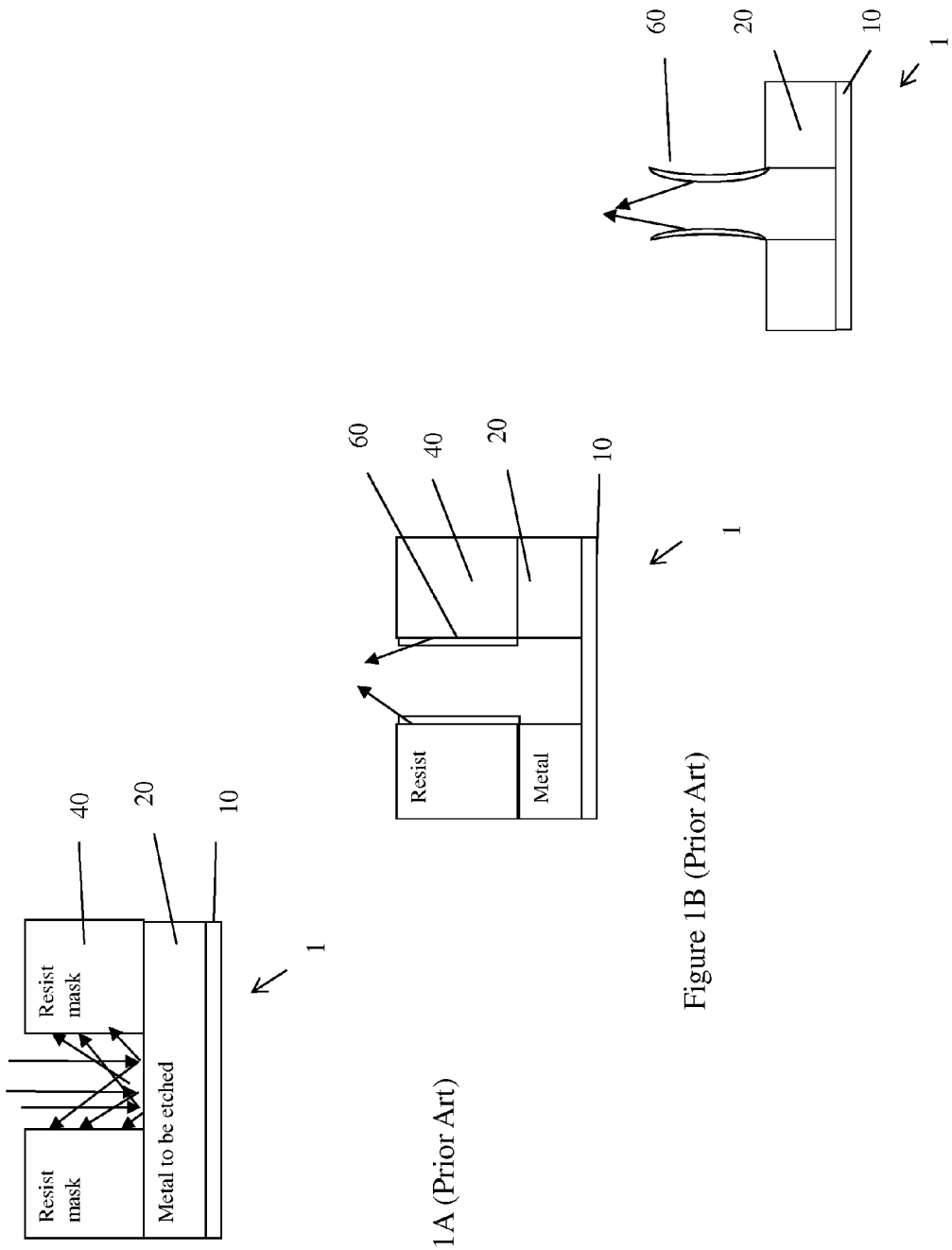

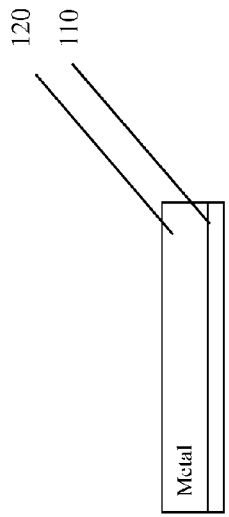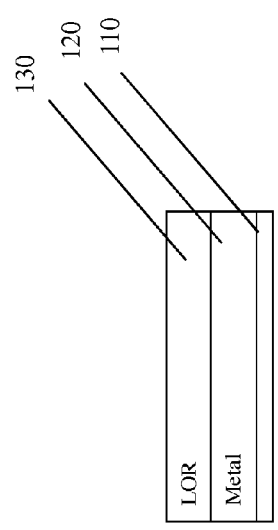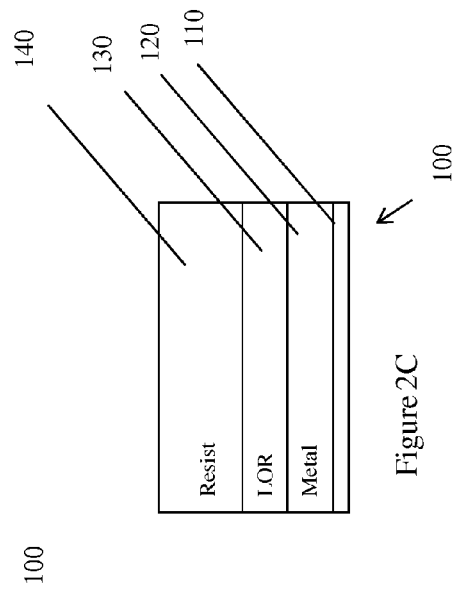
Figure 2A
Figure 2B
Figure 2C

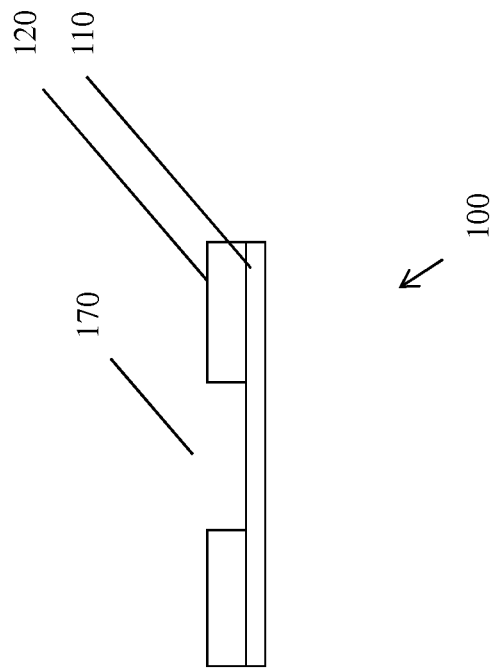

METHOD FOR FORMING A MICROFABRICATED STRUCTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to integrated circuit and microelectromechanical systems (MEMS) devices. More particularly, this invention relates to the formation of patterned metal layers which may be used in the fabrication of the integrated circuits and MEMS devices.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

Magnetically sensitive structures employing effects such as anisotropic magneto resistance (AMR) and giant magnetoresistance (GMR) are well known in the field of magnetic recording, and may also be fabricated using MEMS and integrated circuit lithographic processes. These microfabricated devices provide a response to an applied magnetic field, for example, that arising from individual domains created in a magnetic recording medium. Because of their small size, the AMR and GMR sensors can resolve very small bit sizes and thus increase the density and storage capacity of the recording medium. However, to continually reduce the costs of the storage devices, ever higher information storage densities are being used. Accordingly, this requires ever smaller feature sizes in the magnetic transducers.

The very small feature sizes can be achieved using lithographic MEMS manufacturing techniques. These techniques often use a photosensitive material which is exposed through a mask with very fine features to create a pattern. The mask may have dimensional tolerances of under 1 micron. The patterned photoresist may then be used to create correspondingly small features in the metal or magnetic layers. However, as the feature sizes become ever smaller, the manufacturing process becomes sensitive to an increasing number of defects and failure modes.

For example, as feature sizes get smaller, material removal techniques are required that create relatively vertical sidewalls on the features in order to form a feature with sufficient precision or resolution. Ion milling is one such method for etching metal stacks in the MEMS/Semiconductor industry. Ion milling is a non-selective dry etch technique that is used in MEMS/semiconductor fabrication. The mill rate of various material is dependant on the angle of incidence and sputtering yield of the material. Ion milling is highly directional, forming nearly vertical sidewalls, and is usually done with photo resist as hard mask as described below.

FIG. 1A is a cross-sectional diagram of a prior art method for fabricating a structure 1 on a substrate 10. The method begins by milling fine features in a metal layer 20 on the substrate 10. In the prior art method, a photoresist mask 40 is deposited on the metal layer 20 and exposed through a pattern in a mask. After exposure the photoresist 40 is developed, leaving a void in the areas where the photoresist was not covered by the mask.

The milling process that patterns the metal layer 20 may take place through this void. For example, if ion milling is used to etch a feature in metal layer 20, the ions penetrate the void in the photoresist mask and impinge upon the metal surface of the layer 20, removing material in the metal layer 20. The bombardment of the metal film 20 may cause the metal material to be removed ballistically from the metal layer 20 because of the bombardment by the accelerated ions, and redeposited on surrounding surfaces.

FIG. 1B shows the condition of the substrate 10 and metal layer 20, upon completion of the milling step. After the milling step, a thin metal film 60 may be redeposited on the photoresist layer 40. These metal films 60, often referred to as "fences" or "bat ears" by those skilled in the art, may persist even after removal of the photoresist 40. The situation is shown in FIG. 1C.

The existence of the metal fences 60 on the substrate 10 and metal layer 20 may pose significant manufacturing problems. For example, the fences 60 may be smeared by subsequent polishing of the surface, which may provide an electrically conductive path between areas which should be insulating. This may cause substantial yield loss to the manufacturing concern.

Attempts to remove this fencing commonly involve using variable milling angle, mechanical scrubbing and using sonication with solvent chemistry. Even though the problem may be mitigated with these measures, it cannot be fully eliminated. These additional measures add cost and complexity to the process and may result in additional yield loss from the creation of scratches and debris. Also, these steps may be harsh, and thus ill-advised for delicate devices where mechanical scrubbing can lead to mechanical damage to the device as well. Hence, the prior solution causes yield loss, reliability issues and higher costs.

Accordingly, a method is needed which avoids the formation of these structures on the substrate altogether.

SUMMARY

Described here is a process and technique for removing portions of a thin film from a substrate with a method which does not leave redeposited material on the structure. The method includes the use of a lift off resist (LOR) layer under the regular photoresist in a multilayer stack. Differential development of the LOR+photoresist stack leaves an overhang or discontinuity between the layers, which then prevents a continuous metal buildup along the sidewall of the multilayer stack. To create this overhang, the liftoff resist layer may develop at a faster rate than photo resist, or it may be allowed to continue to dissolve after the photoresist has completed development. In either case, the different development of the LOR relative to the photoresist may result in a break, or overhang, in the continuity between the upper photoresist layer and the lower LOR layer. This discontinuity prevents a continuous metal deposition buildup that is adhered to the substrate. The discontinuity allows the re-deposited material to be easily removed when the photoresist is removed. The removal can subsequently be accomplished with the usual solvents.

Accordingly, a method is described for forming a microfabricated structure on a device layer disposed on a substrate, which includes applying a first layer of a lift off material over the device layer to a first thickness, applying a second layer of photoresist over the first layer to a second thickness, wherein the photoresist develops at a different rate than the lift off material, developing the first layer and the second layer to form a first opening in the first layer and a second opening in the second layer, wherein the second opening overhangs the first opening, patterning the device layer through the first opening and the second opening, and removing the first layer and the second layer.

These and other features and advantages are described in, or are apparent from, the following detailed description.

BRIEF DESCRIPTION OF THE DRAWINGS

Various exemplary details are described with reference to the following figures, wherein:

FIGS. 1A, 1B, and 1C, depict a prior art process for etching a metal film through a photoresist mask;

FIG. 2A is a cross-sectional diagram illustrating the forming a device layer; FIG. 2B is a cross-sectional diagram illustrating the forming of a first lift off layer; FIG. 2C is a cross-sectional diagram illustrating the forming a photoresist layer;

FIG. 7 is a cross-sectional diagram illustrating the condition of the substrate after removal of the lift off and photoresist layers.

It should be understood that the drawings are not necessarily to scale, and that like numbers maybe may refer to like features.

DETAILED DESCRIPTION

Figures 3A, 3B:
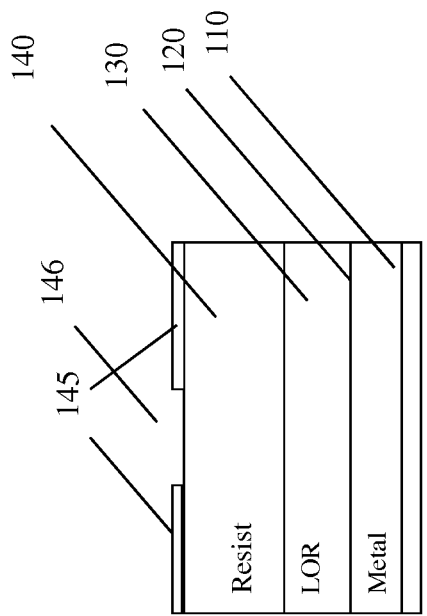
FIG. 3A is a cross-sectional diagram illustrating the applying of a chrome mask on the resist layer.
FIG. 3B is a cross-sectional diagram illustrating the exposing of the photoresist layer through the chrome mask.

The techniques and methods described here may be useful for the formation of lithographically defined features in a thin film deposited on a substrate. The techniques and methods may be especially suitable to forming gaps or voids in previously deposited metal films. These gaps or voids may be formed by, for example, ion milling through an aperture formed in a layer of photoresist deposited over the metal film. However, it should be understood that these techniques and methods may be applied to a wide variety of other sorts of thin films in a lithographic processing scenario. Also, although exemplary materials, dimensions and manufacturing processes are described herein with respect to various embodiments, it should be understood that these details are exemplary only, and that many other examples may be found that fall within the scope of the appended claims.

As described previously and as shown in FIGS. 1A-1C, metal re-deposition during ion milling of fine features is a very common issue that results in fencing 60 at the edges of the voids cut in the metal layers of the devices and leads to yield losses and physical defects. This happens due to re-deposition of the ejected metals along the sidewall of the photoresist 40. The fences 60 if left untreated can result in yield loss such as shorting, scratches, debris and other sources of yield loss.

The techniques disclosed here may solve problem described above, and may be particularly applicable to magnetic, multilayers such as magnetoresistive or giant magnetoresistive structures. These structures often include thin metal films which cannot be chemically etched with a wet etching material. For example, these structures often include gold (Au) or platinum (Pt) thin films. For such materials, dry etch processes such as ion milling may be more appropriate. These milling techniques may also result in more vertical sidewalls, which is important for small, high resolution structures.

In the method described below, a polymeric material such as a liftoff resist (LOR) layer is used under the photo resist that defines the pattern for the milling operation. When the exposed photoresist and accompanying LOR layers are developed, the LOR develops at a faster rate than the photoresist layer, leaving an overhang in the void formed by the developing process. Alternatively, the developer may be allowed to continue to dissolve the underlying lift off layer, after the photoresist has finished development. In either case, the overhang may occur at the boundary between the first (lift off) layer and the second (photoresist) layer. Because of this overhang, the buildup of material of a continuous sidewall in contact with the substrate can be avoided, and the sidewall may have a discontinuity formed therein. Because of this discontinuity, the redeposited material may not be firmly adhered to the substrate, and may be easily removed with the first (LOR) and second (photoresist) layers.

The underlying metal layer may be patterned through the openings in the first and second layers. The overhang or discontinuity does not diminish the resolution or precision of this feature, because the ion milling process is highly vertical, and thus the opening in the metal layer is determined by the opening in the photoresist. Additional details of this method will be described further below, with respect to FIGS. 2-7.

FIG. 2A is a cross-sectional diagram showing the condition of a an exemplary structure 100 formed on a substrate 110 at the beginning of the method being disclosed here. In this first step, the substrate 110 may be covered by a device layer 120. The substrate may be one of number of suitable substrate materials that are well known in the art and often used for applications such as this. The substrate may be, for example, a ceramic, a glass, quartz, a metal, a semiconductor. In one exemplary embodiment, the substrate 110 is a silicon substrate.

Over the substrate 110, the device layer 120 may be deposited. This device layer maybe be comprised of any desired material, but the process is particularly useful for metal layers. Accordingly, the device layer 120 may be, for example, chromium (Cr), cobalt (Co), gold (Au), platinum (Pt), nickel (Ni), iron (Fe) and alloys thereof. Thus, the device layer may be a magnetic material, such as a permeable or permanent magnetic material, or a conductive material. Accordingly, the device layer may be referred to herein as the metal layer 120, however, it should be understood that this is only an exemplary embodiment, and the device layer may include a wide variety of materials, including metals.

One popular permeable material often used in thin film applications is known as Permalloy, which has a composition of between about 60% and about 90% Ni and 40% and 10% iron. The most common composition is 80% Ni and 20% Fe, which has a relative permeability of about 8,000. The techniques described here may be especially suitable for the patterning and etching of magnetic thin films such as permalloy thin films. Thus, the techniques described here may be particularly applicable to the fabrication of AMR and GMR structures.

In one exemplary embodiment, the metal layer is a component of an Anisotropic Magnetoresistive (AMR) multilayer sensor, which makes use of the AMR effect. The Anisotropic Magnetoresistive (AMR) effect shows a change in electrical resistance in the presence of a magnetic field. AMR sensors are typically made of a soft-magnetic material, such as nickel-iron (Permalloy) thin film deposited on a silicon wafer. The magnetoresistive signal may arise as a result of the relative direction between an electrical current and the direction of magnetization in a thin layer of permeable material. An applied magnetic field may rotate this magnetization, thus causing a change in resistivity which may be detected as a change in voltage or an applied current.

Another effect known as Giant Magneto Resistance (GMR) can be exploited by making use of multilayer systems. Here, the magnetoresistive element features a stack of alternating magnetic and non magnetic layers which respond strongly to magnetic fields applied along a particular axis. As with the AMR, the changing field may be detected as a change in voltage of a current applied across the sensor.

Magnetic structures may also be used in compasses, magnetic field sensors and gyroscopes. Any one of these may be an appropriate application of the techniques described here. Accordingly, the device layer may form a component of at least one of an AMR and a GMR structure, a magnetic field sensor, a compass or a gyroscope, for example.

In any case, as shown in FIG. 2A the device layer 120 may be deposited on substrate 110 and may be a magnetic or non-magnetic metal layer, The layer may be on the order of between about 500 Angstroms to about 5000 A, or even sometimes up to 1 micron thick. This metal layer may be deposited by, for example, physical vapor deposition (PVD) or sputter deposition. More generally, the device layer may be deposited to a thickness of between about 0.01 microns and about 1 micron.

After deposition of metal layer 120, a first layer of another material may be deposited in layer 130 as shown in FIG. 2B. This material may be a polymeric material, for example, a lift off resist (LOR). A lift off resist is a polymer material similar to photoresist and commonly used in thin film manufacturing. Lift off resists can protect the substrate surface from processing steps being performed over other areas of the substrate surface, but it is easily and completely removed from the substrate by application of a suitable solvent.

Lift off resist (LOR) can be applied to surfaces in liquid form and then baked to harden. In contrast to photoresists in general, the LOR is not necessarily, or generally, a photosensitive material, and thus is not used as a patterning layer. A distinguishing feature of this lift off resist layer 130 is that the material in LOR layer 130 is developable, i.e. soluble, in the same developer that will be used to develop the patterned photoresist layer 140, to follow as shown in FIG. 2C. The condition of the substrate after the deposition of the lift off layer 130 is shown in FIG. 2B.

Examples of suitable, commercially available lift off materials which go under the trade names LOL 2000, LOR 30b, and LOR 1A. These materials may be deposited to thicknesses of about 0.1 microns to about 2 microns. Another alternative material is polymethylglutarimide (PMGI), which may also be deposited to a thickness of 1000 A to 2 microns.

As mentioned, the LOR material in layer 130 may be applied as a liquid and then baked. As is known generally in the industry, the liquid material may be applied to the center of a disk and the disk spun until the material reaches an even thickness across the surface of the disk. In one embodiment, the LOR material may be spun to a depth of about 0.5 microns. For the reasons that will be discussed below, in one exemplary embodiment, the thickness of the liftoff layer may be at least about the thickness of the device layer 120, or metal layer 120, and more preferably, about twice the thickness of the metal layer 120.

The LOR material 130 may be baked at a temperature of about 180 C, which is sufficiently hot to drive the solvents from the material and harden it. In addition, the temperature of this baking step may be determinative of the dissolution rate of the material when exposed to the developing solution, as will be discussed below with respect to FIG. 7. More generally, the LOR layer may be baked at a temperature between about 160 C and about 200 C for a period between about 5 and about 15 minutes, or whatever conditions are specified by the manufacturer to harden or cure the lift off material. In one exemplary embodiment, the LOR layer 130 may be baked at 180 C for about 7 minutes.

The photoresist layer 140 may be deposited next, as is shown in FIG. 2C. FIG. 2C is a cross-sectional diagram illustrating the condition of the substrate 110 after deposition of the photoresist layer 140. As mentioned previously photoresist layer 140 may be deposited over the lift off layer 130, which in turn, is deposited over the metal layer 120. The photoresist layer 140 may be made of an optically sensitive material. That is, layer 140 may be either a positive or a negative photoresist. Importantly, the photoresist material chosen for this layer 140 may have a different developing rate than the underlying lift off layer 130. In some embodiments, the develop rate of the photoresist layer 140 is slower than the develop rate of the lift off layer 130, by about 25-50%.

Some examples of suitable photoresists are Hoechst AZ 4620, Hoechst AZ 4562, Shipley 1400-17, Shipley 1400-27, Shipley 1400-37. The resists mentioned are, generally, applied in a relatively thick layer—approximately 120 nm to 10 μm—and are positive photoresists, meaning that the exposed areas are removed during the development process.

The photoresist layer 140 may also be spun on in a manner similar to the LOR layer 130, and to a similar thickness, of between about 0.1 microns and about 2 microns. It may also be baked to drive off the solvents, rendering the material solid. In one embodiment, the photoresist layer 140 is baked at a temperature of 90 C for about 4 minutes. This leaves the structure 100 in the condition shown in FIG. 2C. Under the baking conditions for the first LOR layer 130 and the second layer 140 set forth here, the LOR layer 130 may have a developing rate, i.e. rate of material dissolution when exposed to the developing solution, which is 25-50% faster that the developing rate of the photoresist layer 140. This feature may be important as will be clear from the description further below.

A thin layer of chrome 145 may form a mask over photoresist layer 140. FIG. 3A is a cross-section illustrating this masking layer 145. The chrome layer 145 may be sputter deposited and etched to have an aperture size of about 0.5 microns to about 10 microns, and up to hundreds of microns. The aperture is referenced as 146 in FIG. 3A. This aperture 146 may define the pattern that will eventually be etched into the metal layer 120.

The photoresist layer is then illuminated as is shown in FIG. 3B. The illumination may be with a source of 365 nm ultraviolet (UV) wavelength radiation, for example, which may be particularly suitable for i line resists. This illumination may cause a polymerization of the material in the illuminated region 147, which corresponds to the aperture 146 in chrome layer 145. As is required of all photoresist, this cross-linking or polymerization of a portion of photoresist layer 140 renders it soluble in the developing compound. The polymerized portion (if a positive resist) may subsequently be removed in the developing step. The lift off layer 130, in contrast, may be insensitive to the optical illumination.

Figure 4:
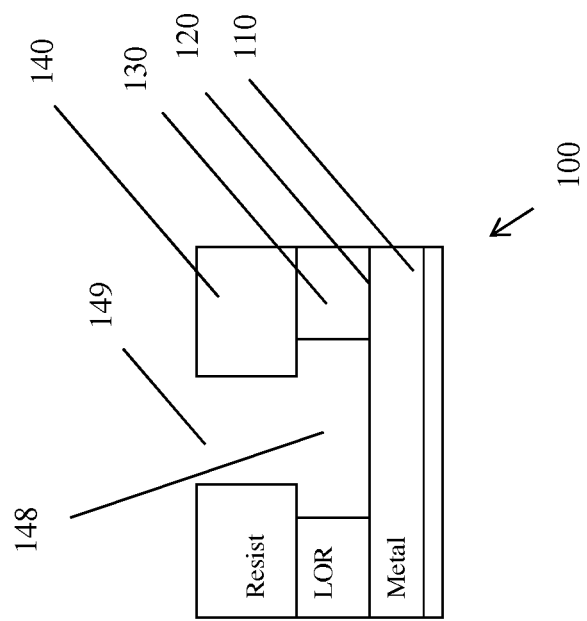
FIG. 4 is a cross-sectional diagram illustrating the condition of the remaining layers on the substrate after the developing step.

FIG. 4 is a cross-sectional diagram showing the condition of the substrate 110, after a developing step in the fabrication process. During this step, the substrate 110, metal layer 120, lift off layer 130, and photoresist layer 140 are all exposed to a developing liquid. This developing liquid causes the dissolution of portions of the photoresist layer 140 and the lift off layer 130, especially in the areas of the photoresist which had been illuminated in the preceding step. The developing liquid may dissolve the liftoff layer at some predetermined rate, regardless of exposure to radiation as the liftoff layer is not generally photosensitive. At the completion of the step, a cavity or a void 148 appears directly above the metal layer 120 allowing access to this portion of the surface of the metal layer by the etching methodology to follow.

As the developing process proceeds, the entire cross-linked area 147 under the aperture 146 that was exposed to the radiation is dissolved by the developer, and the developer begins to dissolve the underlying lift off layer 130. The developing process thus leaves an opening 149 in photoresist layer 140 that corresponds to the aperture 146. However, because the lift off layer 130 is isotropically soluble in the developer solvent, the areas also adjacent to the exposed area 149 are also dissolved. This may leave another opening 148 in the lift off layer 130. Accordingly, the opening 149 formed in photoresist layer 140 may overhang the opening 148 in the lift off layer. Or, in other words, the action of the developer on the lift off layer 130 may form an undercut beneath the opening 149 in the photoresist layer These openings are shown in FIG. 4.

Accordingly, the developer develops the first lift off layer and the second photoresist layer to form a first opening in the first layer (LOR) and a second opening in the second layer (photoresist) wherein the second opening overhangs the first opening.

The lateral extent of the overhang may depend on the thickness of the lift off layer 130, and the duration for which the developer is allowed to act. In one exemplary embodiment, the overhang is on the order of the thickness of the metal or device layer 120, below, or up to 50% larger than this thickness. Such a structure may result using a lift off layer 130 with a thickness twice that of the metal layer 120. It should be noted that the drawings are not necessarily to scale. Accordingly, the overhang may be formed when the lift off material develops at a faster develop rate by between about 25% and about 50% than the photoresist. Alternatively, the overhang of the second opening over the first opening may result from continuing to develop the lift off material after the photoresist material has been completely developed. The extent of the first 148 and the second 149 openings may be on the order of the opening formed in the chrome layer, and with an aperture size of about 0.5 microns to about 10 microns. However, the first opening 148 in the first (LOR) layer 130 may be wider than the second opening 149 in the second photoresist layer 140 because of the extent of the overhang.

The developer may be, for example, a water-based developer such as potassium hydroxide (KOH). The developer may based on AZ 400k which is a mixture of 1 part buffered KOH to 4 part deionized (DI) water. The developer may be applied for about 2 minutes to about 10 minutes at 20 centigrade.

Upon completion of the development, the structure 100 may be rinsed in deionized water to stop the developing process and clean the surfaces.

Patterning of the underlying device layer 120 may now proceeds through this first opening 149 and second opening 148, as will be described next. The metal layer 120 may be patterned by removing the material directly underneath the first opening 149 and the second opening 148. Ideally, the material removal process that forms the final opening 170 shown in FIG. 7 in metal layer 120 is a directional one, such as a milling process.

Figure 5:
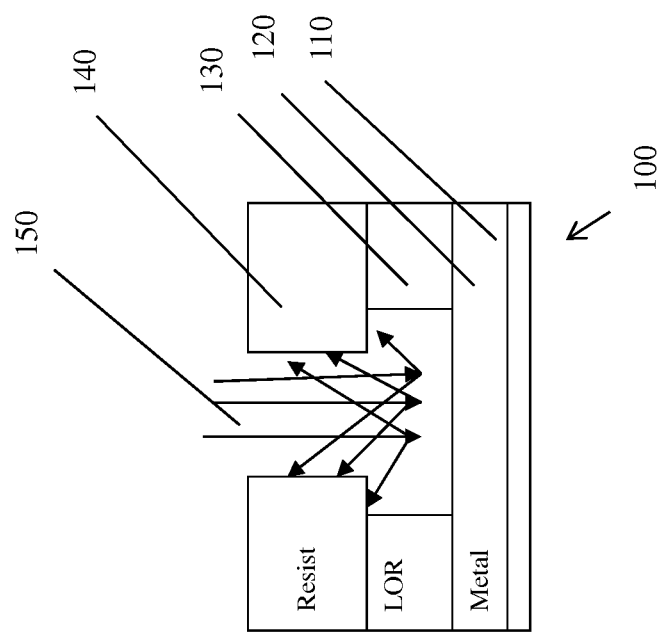
FIG. 5 is a cross-sectional diagram illustrating the condition of the substrate while ion milling the metal layer.

FIG. 5 is a cross-sectional diagram illustrating the condition of the structure 100 during the milling step. This milling step may be, for example, ion milling, wherein charged particles are accelerated into the surface of the metal layer 120. In the ion milling process, ions 150, such as argon ions $Ar^+$ impinge upon the metal layer 120 through the holes 148 and 149 formed in the photo resist layer 140 and the lift off a layer 130, respectively. These ions bombard the surface of the metal layer 120, causing metal material to be ejected from the substrate surface 110, and to be re-deposited on the surrounding surfaces. The situation may be as shown in FIG. 6.

Figure 6:
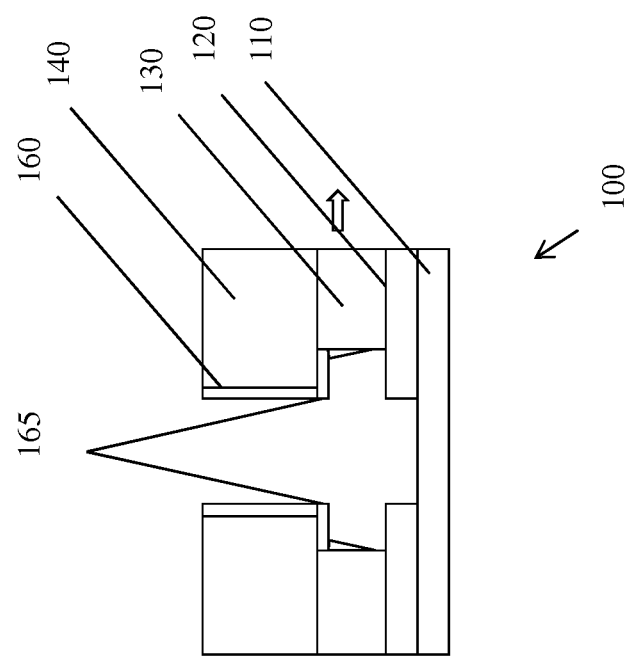
FIG. 6 is a cross-sectional diagram illustrating the condition of the substrate after the ion milling, showing a redeposited metal film.

FIG. 6 is a cross-sectional diagram showing the condition of the substrate after the ion milling step. As mentioned previously, material removed from the metal layer 120 may be re-deposited as metal film 160 on the photoresist surfaces and lift off services 140 and 130 respectively. This re-deposited film 160 corresponds to the fences or "bat ears" shown in FIGS. 1B and 1C as 60. However, importantly, unlike the fences 60, the redeposited film 160 has a discontinuity 165 at the overhang, and is not well adhered to the metal layer 120 or substrate surface 110. Instead, as shown in FIG. 7, a clean void 170 is formed in metal layer 120. Because of this overhang, the re-deposited material may not be contiguous with, or firmly adhered to, the device layer 120 or substrate 110. It should be understood that a "discontinuity" as used herein should be understood to be a surface that is not smoothly varying, but may instead have a sharp corner located at the overhang, and at the boundary between the first layer 130 and the second photoresist layer 140. This discontinuity 165 may result from the conformal nature of the re-deposited film. The thickness of the re-deposited film may be about one-tenth the thickness of the metal, or device layer 120.

Finally, as can be seen qualitatively in FIG. 6, geometrical considerations assure that little or no redeposited material will be formed on the lower edge of LOR layer 130. For at least this reason, the lower surface of the LOR layer 130 is guaranteed to be exposed to the solvent, and so the lift off of LOR layer 130 will not be impeded by the presence of redeposited material 160.

The dimensions of this void 170 correspond closely to the dimensions of the opening 147 in photoresist layer 140 as was shown in FIG. 4. That is, because the ion milling process is highly directional, the dimensional tolerances of the feature formed in metal layer 120 correspond closely to the features formed in the photoresist layer 140. A corresponding void 170 is formed in the device layer 120 directly below the opening 147 in the photoresist layer 140.

The re-deposited metal feature 160 left on the exposed surfaces of opening 148 and opening 149 may be completely removed when the photoresist 140 and lift off layer 130 are removed from the device layer 120 and substrate 110. The complete removal arises from the fact that these fences 160 are not firmly adhered to the metal layer 120 or the substrate 110. In addition, the overhang or undercut forms a discontinuity in the structure, weakening them mechanically. As a result, these features are completely removed when the photoresist layer 140 and lift off a layer 130 are removed. Accordingly, the first (LOR) layer, the second (photoresist) layer and the redeposited material are removed completely in a single same step.

These layers may be removed using the usual techniques known to one of ordinary skill in the art. In one embodiment, the remaining photoresist layer 140, lift off layer 130 and re-deposited material 160 may be removed using a hot N-methyl-2-pyrrolidone (NMP) process which includes a solvent applied at 90 centigrade, along with ultrasonic bath agitation. Alternatively, the layers may be dissolved with acetone, alcohol or methanol, or a combination of solvents. Upon exposure to the solvent and ultrasonics, the photoresist layer 140, lift off layer 130 and re-deposited material 160 may be completely removed.

FIG. 7 is a cross-sectional diagram showing the condition of the substrate after the removal of the photoresist and lift off layers 140 and 130, respectively. As shown in FIG. 7, all that remains is the patterned metal layer 120, free of re-deposited fences and other undesired features. The structure can now be used for subsequent processing steps, such as the formation of other mechanical or electronic features in the device. Accordingly, this technique can be used in any number of MEMS or integrated circuit (IC) devices, such as electrical MEMS switches and MEMS magnetic structures. In one exemplary embodiment, the techniques may be used in the fabrication of a MEMS electrostatic switch such as that described in U.S. Pat. No. 7,864,006 issued Jan. 4, 2011, incorporated by reference in its entirety. In another exemplary embodiment, the techniques may be used in the fabrication of a magnetic sensor, as described in U.S. patent application Ser. No. 13/987,463, filed Jul. 29, 2013, also incorporated by reference in its entirety.

Because the surface has been cleared of all photoresist, lift off material and fences, the process is essentially complete after this step. Accordingly, harsh downstream processing using mechanical brushing and ultrasonic solvent cleans may be unnecessary. This may improve the overall process yields, as the additional steps may cause further damage and yield loss.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure.

What is claimed is:

1. A method for forming a microfabricated structure on a substrate, comprising:
    applying a first layer of a lift off material over a device layer to a first thickness wherein the first thickness of the lift off material is at least twice the thickness of the device layer;
    applying a second layer of photoresist over the first layer to a second thickness, wherein the photoresist develops at a different rate than the lift off material;
    developing the first layer and the second layer to form a first opening in the first layer and a second opening in the second layer, wherein the second opening overhangs the first opening, forming an overhang;
    patterning the device layer through the first opening and the second opening; and
    removing the first layer and the second layer.

2. The method of claim 1, wherein the device layer comprises a magnetic material.

3. The method of claim 1, wherein the lift off material comprises a polymeric material, and is deposited to a thickness of between about 0.1 microns and about 2 microns.

4. The method of claim 1, wherein the second layer comprises at least one of a positive and a negative photoresist, and is deposited to a thickness of between about 0.1 microns and about 2 microns.

5. The method of claim 1, wherein the device layer comprises at least one of the following: a permeable magnetic material, a permanent magnetic material, and a conductive material.

6. The method of claim 1, wherein the device layer comprises at least one of chromium (Cr), cobalt (Co), gold (Au), platinum (Pt), nickel (Ni), iron (Fe) and alloys thereof, and is deposited to a thickness of between about 0.01 microns and about 1 microns.

7. The method of claim 1, wherein the device layer comprises a component of at least one of an AMR and a GMR structure, a magnetic field sensor, a compass or a gyroscope.

8. The method of claim 1, wherein the first opening and the second opening are each about 0.5 microns wide to about 9 microns wide.

9. The method of claim 1, wherein patterning the device layer comprises ion milling an opening in the device layer using argon ions through the first opening and the second opening.

10. The method of claim 1, further comprising:
    removing the first layer and the second layer with a solvent in an ultrasonic bath.

11. The method of claim 10, wherein the overhang of the second opening over the first opening results when the lift off material develops at a faster rate by between about 25% and about 50% compared to the photoresist.

12. The method of claim 1, wherein the overhang of the second opening over the first opening results from continuing to develop the lift off material after the photoresist material has been completely developed.

13. The method of claim 1, further comprising exposing the photoresist to UV radiation.

14. The method of claim 1, further comprising re-depositing material from the device layer onto nearby surfaces of the first opening and the second opening.

15. The method of claim 14, wherein the re-deposited material has a discontinuity between the first opening and the second opening.

16. The method of claim 14, further comprising removing the first layer, the second layer and the re-deposited material in a single same step.

17. The method of claim 16, wherein the single step comprises removing the lift off material, the photoresist and the re-deposited material with a solvent that includes at least one of acetone, alcohol or methanol.

18. The method of claim 17, wherein the single step further includes heating the solvent.

19. The method of claim 1, wherein a lateral extent of the overhang is up to 50% larger than the thickness of the device layer.

* * * * *